(12) United States Patent
Jeong et al.

(10) Patent No.: US 7,307,874 B2
(45) Date of Patent: Dec. 11, 2007

(54) METHODS OF OPERATING MAGNETIC RANDOM ACCESS MEMORY DEVICES INCLUDING MAGNETS ADJACENT MAGNETIC TUNNEL JUNCTION STRUCTURES

(75) Inventors: Won-Cheol Jeong, Seoul (KR); Jae-Hyun Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 211 days.

(21) Appl. No.: 11/177,641

(22) Filed: Jul. 8, 2005

(65) Prior Publication Data

US 2006/0092698 A1 May 4, 2006

(30) Foreign Application Priority Data

Oct. 21, 2004 (KR) ............... 10-2004-0084584

(51) Int. Cl.
*G11C 11/14* (2006.01)
*G11C 11/15* (2006.01)
*G11C 11/16* (2006.01)

(52) U.S. Cl. ............... 365/158; 365/171; 365/173; 365/133; 365/225.5

(58) Field of Classification Search ............... 365/133, 365/158, 171, 173, 232, 225.5, 243.5, 55, 365/62
See application file for complete search history.

(56) References Cited

U.S. PATENT DOCUMENTS

| 6,130,814 | A | 10/2000 | Sun |
| 6,525,957 | B1 | 2/2003 | Goronkin et al. |
| 6,603,677 | B2 | 8/2003 | Redon et al. |
| 2002/0159203 | A1* | 10/2002 | Saito et al. ............... 365/158 |
| 2003/0007398 | A1* | 1/2003 | Daughton et al. ............... 365/200 |
| 2003/0059588 | A1* | 3/2003 | Hannah et al. ............... 428/200 |
| 2004/0228171 | A1* | 11/2004 | Ho et al. ............... 365/158 |
| 2004/0257863 | A1* | 12/2004 | Sato et al. ............... 365/158 |
| 2005/0002228 | A1* | 1/2005 | Dieny et al. ............... 365/171 |

FOREIGN PATENT DOCUMENTS

| JP | 2001-084758 | 3/2001 |
| JP | 2001-195878 | 7/2001 |
| JP | 2003-258209 | 9/2003 |
| JP | 2004-087519 | 3/2004 |
| KR | 1020030046873 A | 6/2003 |

OTHER PUBLICATIONS

Office Action corresponding to Korean Application No. 10-2004-0084584 dated Jan. 26, 2006.

* cited by examiner

*Primary Examiner*—J. H. Hur
(74) *Attorney, Agent, or Firm*—Myers Bigel Sibley & Sajovec, PA

(57) ABSTRACT

A magnetic random access memory device may include a memory cell access transistor on a substrate, a bit line spaced apart from the substrate, and a magnetic tunnel junction structure electrically coupled between the bit line and the memory cell access transistor. At least one magnet may be positioned adjacent a sidewall of the magnetic tunnel junction structure and may be configured to provide a magnetic field through the magnetic tunnel junction structure. Related methods of operating magnetic random access memory devices are also discussed.

3 Claims, 10 Drawing Sheets

METHODS OF OPERATING MAGNETIC RANDOM ACCESS MEMORY DEVICES INCLUDING MAGNETS ADJACENT MAGNETIC TUNNEL JUNCTION STRUCTURES

CROSS-REFERENCE TO RELATED APPLICATION

This application claims priority from Korean Patent Application No. 10-2004-0084584, filed Oct. 21, 2004, the disclosure of which is hereby incorporated by reference herein in its entirety.

FIELD OF THE INVENTION

The present invention relates to semiconductor memory devices and, more particularly, to magnetic random access memory devices and methods.

BACKGROUND OF THE INVENTION

Magnetic random access memory (MRAM) devices are non-volatile memory devices, in which information may be stored based on a magnetoresistive effect of an electrically conductive material therein. In particular, the resistance of the electrically conductive material may be changed depending on an applied magnetic field. MRAM devices may include a plurality of MRAM cells made up of magnetic tunnel junction structures (MTJs) on a single transistor.

The MTJ structure may include multiple thin layers, such as a thin insulating layer sandwiched between two thin ferromagnetic layers. Electrons may tunnel through the thin insulating layer when an external electrical signal is applied. The upper thin magnetic layer is called a free layer, and the lower thin magnetic layer is called a pinned layer.

When the magnetization directions of the free layer and the pinned layer are parallel to each other, a tunneling current flowing through the MTJ may be increased. In other words, the tunneling resistance of the junction may be reduced. In contrast, when the magnetization directions of the free layer and the pinned layer are antiparallel to each other, the tunneling current flowing through the MTJ may be decreased, i.e., the tunneling resistance of the junction may be increased.

MRAM devices may employ magnetic charges to store information, in contrast to conventional memory devices which may employ electrical charges. In other words, digital data (represented by "0" and "1") may be stored based on a low resistance state (in which the magnetization directions of the two thin magnetic layers are parallel to each other) and a high resistance state (in which the magnetization directions of the two thin magnetic layers are antiparallel to each other).

An anti-ferromagnetic layer, referred to as a pinning layer, may be added to the pinned layer. The pinning layer may serve to fix the magnetization direction of the pinned layer. In particular, the pinned layer may be directly on the pinning layer and may have a relatively large switching field. The magnetization direction of the pinned layer may be fixed in a constant direction when an applied magnetic field is less than the switching field. Thus, the digital data stored in the MRAM cell (i.e., "0" or "1") may be determined based on the magnetization direction of the free layer. The magnetization direction of the free layer may be changed by the application of a magnetic field. More particularly, to change the magnetization direction of the free layer to a desired direction, conductive interconnections (such as a bit line and/or a digit line) may be formed orthogonal to each other above and below the MTJ. Then as current flows through each conductive interconnection, a magnetic field may be induced by the current.

MTJs may be provided having a rectangular or elliptical shape when seen in a plan view, as magnetic spins in the free layer may be in a more stable state when the magnetic spins are parallel to the longitudinal direction of the free layer.

An MRAM device may include a plurality of MTJs, which may have non-uniform switching characteristics based on their respective fabrication processes. As such, the external magnetic fields for storing desired data in the respective MTJs may be different from one another. Accordingly, the greater the number of MTJs, having non-uniform switching characteristics, the lower the write margin for the MRAM device. In particular, when the MTJs are scaled down to provide higher integration density, the write margin may be significantly reduced. In other words, during a write operation for storing desired data in a selected one of the MTJs, undesired data may be written to other non-selected MTJs that share the bit line and/or the digit line electrically connected to the selected MTJ. As such, with conventional writing methods, write disturbance may occur, and undesired data may be stored in non-selected MTJs during a write operation for storing data in a selected MTJ.

Furthermore, a conventional MRAM cell may have a digit line disposed around the MTJ. Typically, the digit line may be positioned below the MTJ, and the MTJ may have a lower electrode overlapping the digit line. The lower electrode may be electrically connected to a drain region of an access transistor below the digit line. Thus, the lower electrode may extend along a horizontal direction to connect to a contact plug to be formed on the drain region. As a result, an amount by which the planar area of the MRAM cell can be reduced may be limited due to presence of the digit line.

In recent years, MRAM devices have been introduced which employ a spin injection mechanism to address problems related to write disturbance and/or integration density. For example, MRAM devices employing a spin injection mechanism are disclosed in U.S. Pat. No. 6,130,814 to Sun entitled "Current-induced magnetic switching device and memory including the same". Other MRAM devices employing a spin injection mechanism are disclosed in U.S. Pat. No. 6,603,677 to Redon et al. entitled "Three-Layered Stacked Magnetic Spin Polarization Device with Memory". The disclosures of U.S. Pat. Nos. 6,130,814 and 6,603,677 are hereby incorporated by reference herein in their entirety.

However, in order to switch the MRAM cell using a spin injection mechanism, a write current density greater than a critical current density may be required. As such, the access transistor may require sufficient drive current capability to provide a write current that is greater than the critical current density. In other words, for MRAM cells employing spin injection mechanisms, scale-down may be limited by current requirements of the access transistors.

SUMMARY OF THE INVENTION

Some embodiments of the present invention may provide methods of operating an MRAM device capable of reducing a write current used to successfully switch the selected MRAM cell between a high and a low resistance state.

In some embodiments of the present invention, methods may be provided to program and read a magnetic random access memory device with a magnetic tunnel junction (MTJ). The programming methods may include disposing at least one pair of magnets at both sides of the MTJ to apply a hard axis magnetic field to the MTJ, and forcing a write current to the MTJ. The write current may be a positive write current flowing from a free layer of the MTJ to a pinned layer of the MTJ or a negative write current flowing from the pinned layer of the MTJ to the free layer of the MTJ. As a result, magnetic polarizations in the free layer may be oriented parallel to or antiparallel to magnetic polarizations in the pinned layer.

Forcing the write current may include turning on a switching device electrically connected to one terminal of the MTJ, and applying a writing signal to a bit line electrically connected to the other terminal of the MTJ. In this case, the positive write current or the negative write current may flow through both the MTJ and the switching device connected to the MTJ.

The magnet may be a permanent magnet or an electromagnet. In addition, the magnet may be disposed in a hard axis direction of the MTJ.

The free layer and/or the pinned layer may be a synthetic anti-ferromagnetic (SAF) layer including a bottom ferromagnetic layer, a top ferromagnetic layer, and an anti-ferromagnetic coupling spacer layer positioned between the bottom and top ferromagnetic layers.

Reading the MRAM device may include applying a read voltage to both terminals of the MTJ to sense an amount of read current flowing through the MTJ. The read current may be smaller than the write current.

In other embodiments of the present invention, methods may be provided to program and read a magnetic random access memory device with a magnetic tunnel junction (MTJ) and a bit line. The programming methods may include disposing a magnetic layer covering sidewalls and a top surface of the bit line to apply a hard axis magnetic field to the MTJ, and forcing a write current to the MTJ. The write current may be a positive write current flowing from a free layer of the MTJ to a pinned layer of the MTJ or a negative write current flowing from the pinned layer of the MTJ to the free layer of the MTJ. As a result, magnetic polarizations in the free layer may be oriented parallel to or antiparallel to magnetic polarizations in the pinned layer.

The magnetic layer may be a permanent magnet or an electromagnet.

The bit line may be disposed parallel to an easy axis of the MTJ or disposed to have a plane intersection angle less than 90° from the easy axis.

In yet other embodiments of the present invention, methods may be provided to program and read a magnetic random access memory device with a magnetic tunnel junction (MTJ) and a bit line. The programming methods may include disposing at least one pair of magnets at both sides of the MTJ, disposing a magnetic layer covering sidewalls and a top surface of the bit line to apply a hard axis magnetic field to the MTJ; and forcing a write current to the MTJ. The write current may be a positive write current flowing from a free layer of the MTJ to a pinned layer of the MTJ or a negative write current flowing from the pinned layer of the MTJ to the free layer of the MTJ. As a result, magnetic polarizations in the free layer may be oriented parallel to or antiparallel to magnetic polarizations in the pinned layer.

In some embodiments of the present invention, a magnetic random access memory device may include a memory cell access transistor on a substrate, a bit line spaced apart from the substrate, and a magnetic tunnel junction structure electrically coupled between the bit line and the memory cell access transistor. At least one magnet adjacent a sidewall of the magnetic tunnel junction structure may be configured to provide a magnetic field through the magnetic tunnel junction structure. For example, the at least one magnet may be configured to provide the magnetic field along a hard magnetization axis of the magnetic tunnel junction structure.

In other embodiments, a distance between the bit line and the substrate may be greater than a distance between the at least one magnet and the substrate. The at least one magnet may include a pair of magnets adjacent opposing sidewalls of the magnetic tunnel junction structure at opposite sides of the bit line.

In some embodiments, the magnetic random access memory device may further include a controller coupled to the memory cell access transistor, the bit line, and the magnetic field conductive line. The controller may be configured to provide a writing current through the bit line, through the magnetic tunnel junction structure and through the memory cell access transistor while the at least one magnet provides the magnetic field through the magnetic tunnel junction structure. For example, the controller may be configured to provide a first writing current in a first direction to reduce a resistance of the magnetic tunnel junction structure. The controller may also be configured to provide a second write current in a second direction opposite the first direction to increase the resistance of the magnetic tunnel junction structure.

In addition, in some embodiments, the controller may be configured to provide a read current that is less than the writing current through the bit line, through the magnetic tunnel junction structure and through the memory cell access transistor. The controller may be configured to determine a program status of the magnetic tunnel junction structure based on the read current.

In other embodiments, the magnetic tunnel junction structure may include a pinned layer, a free layer, and an insulating layer therebetween. The at least one magnet may be configured to provide the magnetic field through the free layer of the magnetic tunnel junction structure.

In some embodiments, the free layer and the pinned layer may be formed of a same material. In other embodiments, at least one of the pinned layer and/or the free layer may be a synthetic anti-ferromagnetic layer.

In some embodiments, the at least one magnet may be at least one permanent magnet. In other embodiments, the at least one magnet may be at least one electromagnet.

In some embodiments, the at least one magnet may be a first magnet configured to provide a first magnetic field through the magnetic tunnel junction structure. A second magnet on opposing sidewalls of the bit line and a surface therebetween opposite the magnetic tunnel junction structure may be configured to provide a second magnetic field through the magnetic tunnel junction structure along a same direction as the first magnetic field.

According to other embodiments of the present invention, a magnetic random access memory device may include a memory cell access transistor on a substrate, a bit line spaced apart from the substrate, and a magnetic tunnel junction structure electrically coupled between the bit line and the memory cell access transistor.

A magnet on opposing sidewalls of the bit line and a surface therebetween opposite the magnetic tunnel junction structure may be configured to provide a magnetic field through the magnetic tunnel junction structure. For example, the magnet may be configured to provide the magnetic field along a hard magnetization axis of the magnetic tunnel junction structure.

In some embodiments, the magnetic random access memory device may include a controller coupled to the memory cell access transistor, the bit line, and the magnetic field conductive line. The controller may be configured to provide a writing current through the bit line, through the magnetic tunnel junction structure and through the memory cell access transistor while the magnet provides the magnetic field through the magnetic tunnel junction structure. For example, the controller may be configured to provide a first writing current in a first direction to reduce a resistance of the magnetic tunnel junction structure. Also, the controller may be configured to provide a second write current in a second direction opposite the first direction to increase the resistance of the magnetic tunnel junction structure.

In other embodiments, the controller may be configured to provide a read current that is less than the writing current through the bit line, through the magnetic tunnel junction structure and through the memory cell access transistor. The controller may be configured to determine a program status of the magnetic tunnel junction structure based on the read current.

In some embodiments, the magnet may be a permanent magnet. In other embodiments, the magnet may be an electromagnet.

In some embodiments, the magnet may be a first magnet configured to provide a first magnetic field through the magnetic tunnel junction structure. A pair of second magnets adjacent opposing sidewalls of the magnetic tunnel junction structure may be configured to provide a second magnetic field through the magnetic tunnel junction structure along a same direction as the first magnetic field.

According to further embodiments of the present invention, a method of operating a magnetic random access memory device is provided. The magnetic random access memory device may include a memory cell having a magnetic tunnel junction structure connected between a bit line and a memory cell access transistor on a substrate, and at least one magnet adjacent a sidewall of the magnetic tunnel junction structure. A magnetic field may be provided through the magnetic tunnel junction structure using the at least one magnet. A writing current may be provided through the bit line, through the magnetic tunnel junction structure and through the memory cell access transistor while providing the magnetic field.

In some embodiments, the at least one magnet may include a pair of magnets adjacent opposing sidewalls of the magnetic tunnel junction structure. The magnetic field may be provided along a hard magnetization axis of the magnetic tunnel junction structure.

In other embodiments, a first writing current may be provided in a first direction to reduce a resistance of the magnetic tunnel junction structure. Also, a second writing current may be provided in a second direction opposite the first direction to increase the resistance of the magnetic tunnel junction structure.

In some embodiments, a read current that is less than the writing current may be provided through the bit line, through the magnetic tunnel junction structure and through the memory cell access transistor. A program status of the magnetic tunnel junction structure may be determined based on the read current.

In other embodiments, the at least one magnet may be at least one electromagnet. A current may be provided through the electromagnet to generate the magnetic field.

In some embodiments, the at least one magnet may be a first magnet, and the magnetic field may be a first magnetic field. A second magnetic field may be provided through the magnetic tunnel junction structure in a same direction as the first magnetic field using a second magnet on opposing sidewalls of the bit line and a surface therebetween opposite the magnetic tunnel junction structure. The writing current may be provided while providing the second magnetic field.

According to still further embodiments of the present invention, a method of operating a magnetic random access memory device is provided. The magnetic random access memory device may include a memory cell having a magnetic tunnel junction structure connected between a bit line and a memory cell access transistor on a substrate, and a magnet on opposing sidewalls of the bit line and a surface therebetween opposite the magnetic tunnel junction structure. A magnetic field may be provided through the magnetic tunnel junction structure using the magnet. A writing current may be provided through the bit line, through the magnetic tunnel junction structure and through the memory cell access transistor while providing the magnetic field.

In some embodiments, the magnetic field may be provided along a hard magnetization axis of the magnetic tunnel junction structure.

In other embodiments, the magnet may be an electromagnet. A current may be provided through the electromagnet to generate the magnetic field.

In some embodiments, the magnet may be a first magnet and the magnetic field may be a first magnetic field. A second magnetic field may be provided through the magnetic tunnel junction structure in a same direction as the first magnetic field using a pair of second magnets adjacent opposing sidewalls of the magnetic tunnel junction structure at opposite sides of the bitline. The writing current may be provided while providing the second magnetic field.

DETAILED DESCRIPTION OF THE INVENTION

Figure 1:
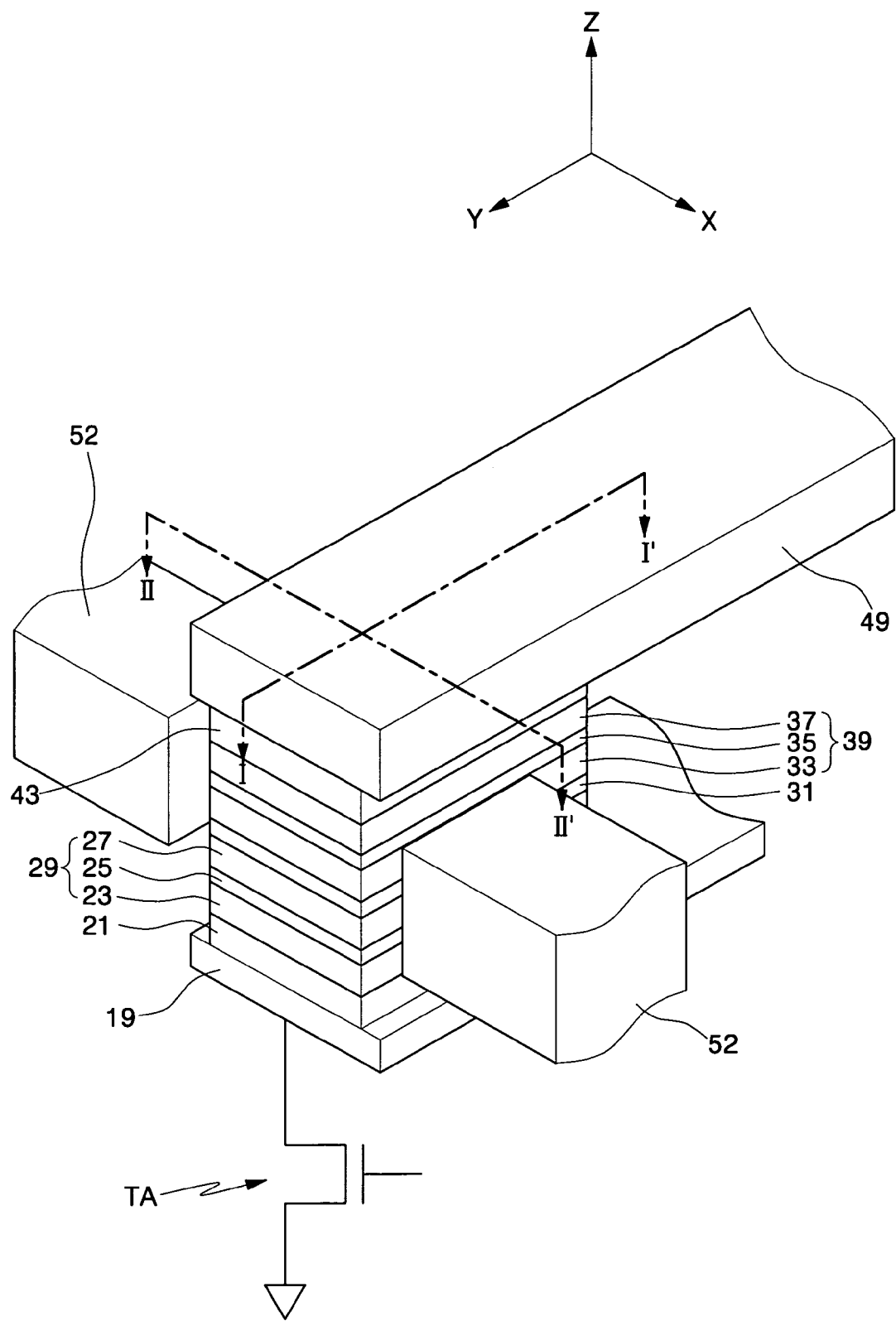
FIG. 1 is a perspective view of an MRAM device in accordance with some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top", may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can, therefore, encompass both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 2:
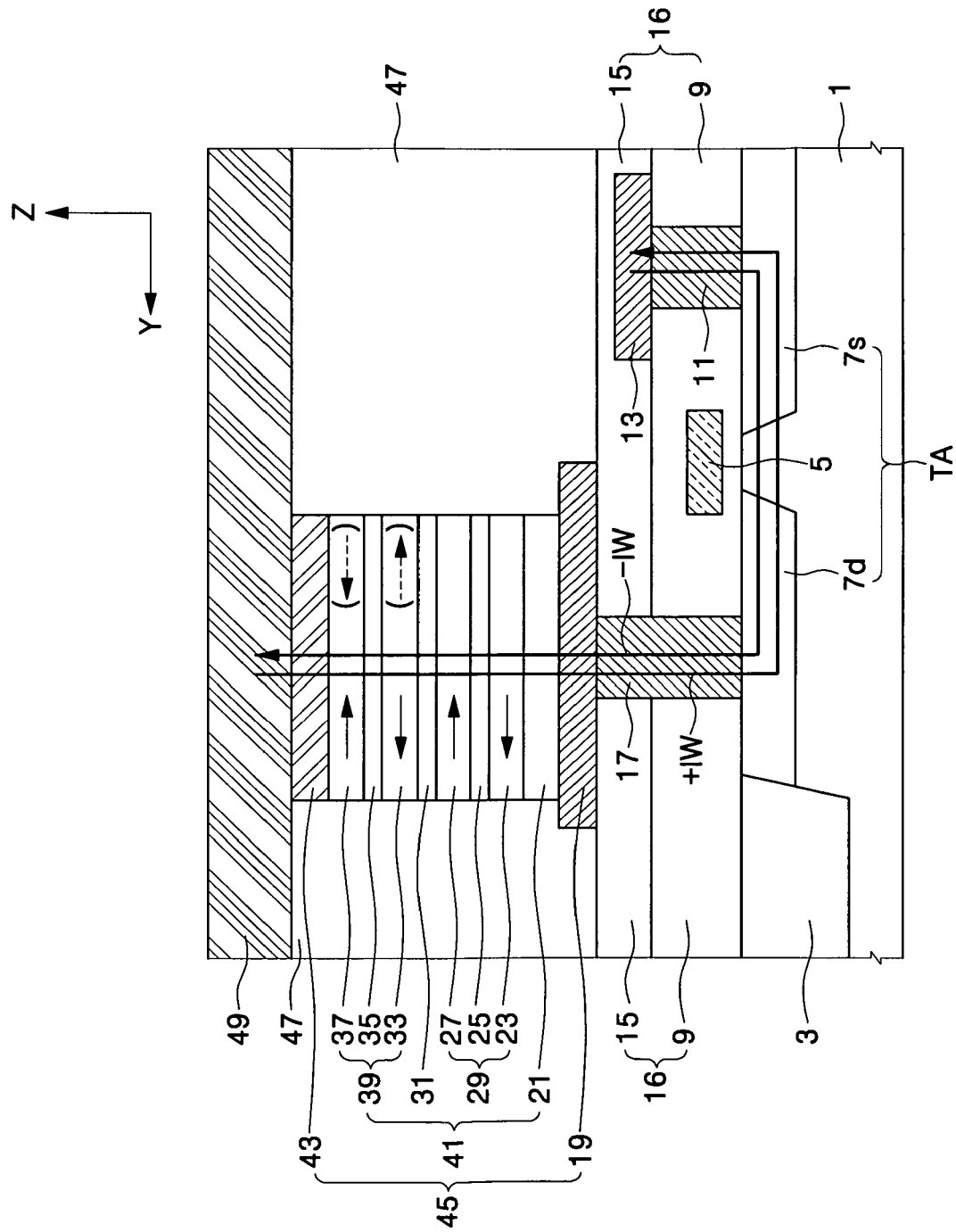
FIG. 2 is a cross-sectional view taken along line I-I' of FIG. 1.

FIG. 1 is a perspective view of an MRAM device in accordance with some embodiments of the present invention. FIG. 2 is a cross-sectional view taken along line I-I' of FIG. 1, and FIG. 3 is a cross-sectional view taken along line II-II' of FIG. 1.

Figure 3:
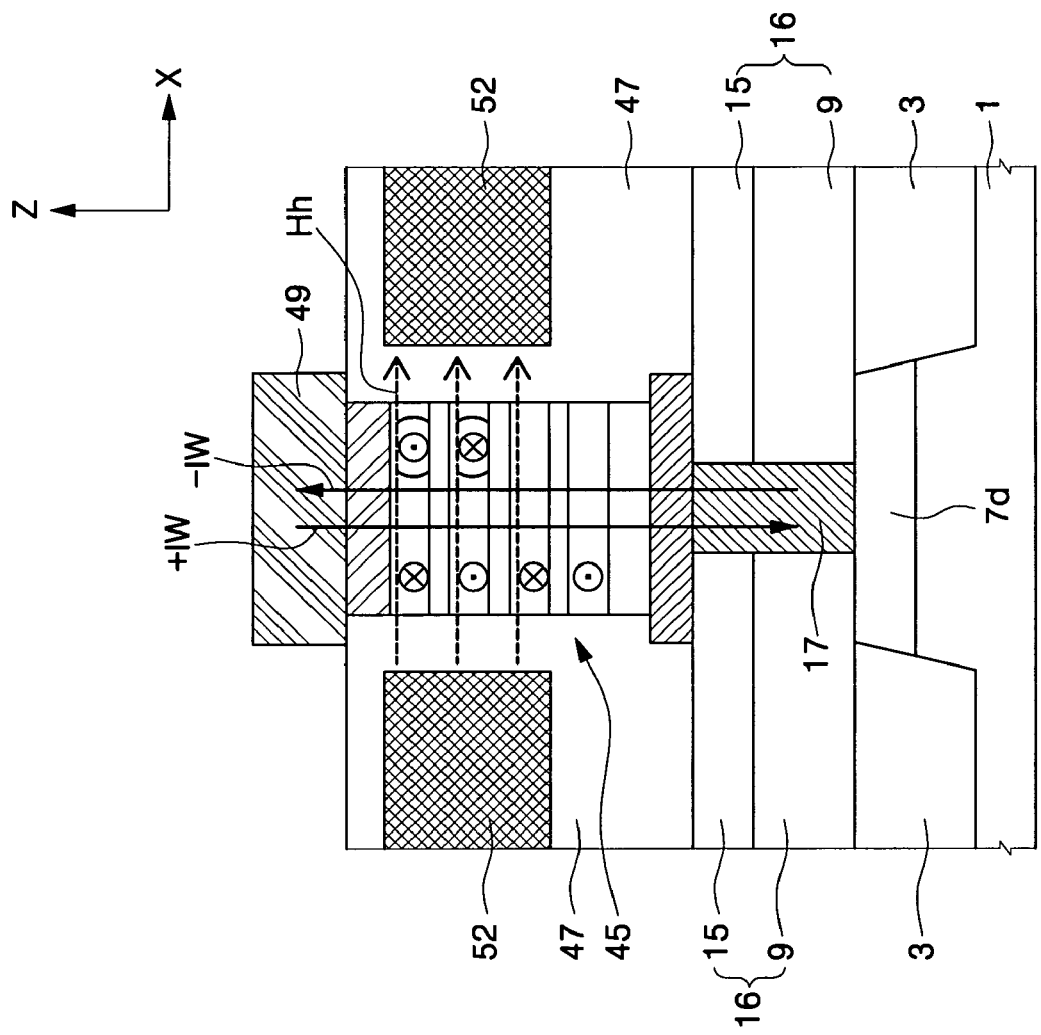
FIG. 3 is a cross-sectional view taken along line II-II' of FIG. 1.

Referring now to FIGS. 1, 2, and 3, an MRAM device according to some embodiments of the present invention includes an isolation layer 3, a drain region 7d, a source region 7s, and a channel region in a predetermined region of an integrated circuit (IC) substrate 1. The channel region is positioned between the drain region 7d and the source region 7s, and an insulated gate electrode 5 is positioned above the channel region. The gate electrode 5 may serve as a word line. Consequently, the drain region 7d, the source region 7s, and the gate electrode 5 define a switching device, for example, an access transistor TA, on the substrate 1.

A first lower interlayer insulating layer 9 is formed on the substrate 1 including the access transistor TA. The source region 7s may be exposed by a source contact hole extending through the first lower interlayer insulating layer 9, and the source contact hole may be filled by a source contact plug 11. A source line 13 is formed on the source contact plug 11. As such, the source line 13 is electrically connected to the source region 7s via the source contact plug 11.

A first upper interlayer insulating layer 15 is formed on the substrate 1 including the source line 13. The first lower interlayer insulating layer 9 and the first upper interlayer insulating layer 15 form a first interlayer insulating layer 16. The drain region 7d may be exposed by a drain contact hole extending through the first interlayer insulating layer 16. The drain contact hole may be filled by a drain contact plug 17. As such, the drain contact plug 17 is electrically connected to the drain region 7d.

A magnetic resistor 45 is formed on the first interlayer insulating layer 16 and on the drain contact plug 17. The magnetic resistor 45 includes a lower electrode 19, an upper electrode 43, and a magnetic tunnel junction structure (MTJ) 41 positioned therebetween. The MTJ 41 includes a pinned layer 29, a free layer 39, and a tunneling insulating layer 31 positioned between the pinned layer 29 and the free layer 39. Furthermore, the MTJ 41 may include a pinning layer 21 contacting the pinned layer 29. Respective layers 19, 21, 29, 31, 39, and 43 of the magnetic resistor 45 may be stacked in various orders. For example, the lower electrode 19 may be in contact with the drain contact plug 17, and the pinning layer 21, the pinned layer 29, the tunneling insulating layer 31 and the free layer 39 may be stacked on the lower electrode 19 in the above order.

The free layer 39 may be a single layer of ferromagnetic material, or a synthetic anti-ferromagnetic (SAF) layer having a lower ferromagnetic layer 33, an anti-ferromagnetic coupling spacer layer 35, and an upper ferromagnetic layer 37 which are sequentially stacked as shown in FIGS. 2 and 3.

In addition, the pinned layer 29 may be a single layer of ferromagnetic material, or a synthetic anti-ferromagnetic (SAF) layer having a lower ferromagnetic layer 23, an anti-ferromagnetic coupling spacer layer 25, and an upper ferromagnetic layer 27 which are sequentially stacked as shown in FIGS. 2 and 3.

A second interlayer insulating layer 47 is formed on the first interlayer insulating layer 16 and on the magnetic resistor 45. A bit line 49 is formed on the second interlayer insulating layer 47. The bit line 49 is electrically connected to the magnetic resistor 45 via the upper electrode 43.

The MTJ 41 may have a rectangular or an elliptical shape (including a length and a width that is smaller than the length) when seen in a plan view. As such, the MTJ 41 may have an easy magnetization axis along the length direction (parallel to the substrate) and a hard magnetization axis along the width direction (parallel to the substrate and perpendicular to the length direction).

At least one pair of magnets 52 may be positioned at opposing sidewalls of the MTJ 41. More particularly, one of the magnets 52 may be positioned at one side of the hard axis, and the other may be positioned at the other side of the hard axis. The magnets 52 may be spaced apart from the MTJ 41 by portions of the second interlayer 47. The magnets 52 may be permanent magnets and/or electromagnets.

Methods for writing and/or programming an MRAM device according to some embodiments of the present invention will now be described with reference to FIGS. 1, 2, and 3.

Referring again to FIGS. 1, 2, and 3, a word line signal is applied to the word line (i.e., the gate electrode 5) of the access transistor TA and a bit line write signal is applied to the bit line 49. The word line signal may be a voltage pulse signal having a voltage higher than a threshold voltage of the access transistor TA, and may be applied for a predetermined time. The access transistor TA connected to the word line 5 is turned on while the word line signal is applied. The bit line write signal may be a current pulse signal providing current to the bit line when the word line signal is applied. As a result, an MRAM cell connected to the word line and the bit line may be selected, and a writing current may flow through the MTJ of the selected MRAM cell and the access transistor TA serially connected to the cell. For example, when the word line signal and the bit line write signal are applied to the word line 5 and the bit line 49, respectively, the MRAM cell connected to the word line 5 and the bit line 49 may be selected, and the write current may flow through the MTJ 41 of the selected MRAM cell.

The write current may be a positive write current +IW which flows from the free layer 39 to the pinned layer 29 in the selected MTJ 41, or a negative write current −IW which flows from the pinned layer 29 to the free layer 39 in the selected MTJ 41. As used herein, "current" refers to the flow of electrical charges from a higher potential to a lower potential. As such, the positive write current +IW flows in a direction of the negative Z-axis, as shown in FIGS. 2 and 3, and the negative write current −IW flows in a direction of the positive Z-axis, as also shown in FIGS. 2 and 3. More particularly, electrons flow in the positive Z-axis direction when the positive write current +IW is applied, and electrons flow in the negative Z-axis direction when the negative write current −IW is applied.

When the source line 13 is grounded during a writing/programming operation, the positive write current +IW may be generated by applying a positive program voltage to the selected bit line. Similarly, when the source line 13 is grounded during the writing/programming operation, the negative write current −IW may be generated by applying a negative program voltage to the selected bit line.

When the positive write current +IW flows through the selected MTJ 41, a majority of the electrons passing through the pinned layer 29 may be changed to have spins in the same magnetization direction as the fixed magnetic polarizations and/or moments in the pinned layer 29. For example, when a majority of the magnetic polarizations/moments have up-spins in the pinned layer 29, a majority of the electrons passing through the pinned layer 29 may be changed to have up-spins. In particular, when the pinned layer 29 is a SAF layer as described above, a majority of the electrons are changed to have spins in the same magnetization direction as that of the upper ferromagnetic layer 27 of the SAF pinned layer.

The up-spin electrons may pass through the tunneling insulating layer 31 to reach the free layer 39. The number of up-spin electrons reaching the free layer 39 may be proportional to the current density of the positive write current +IW. As a result, when the positive write current density is increased, a majority of the magnetic polarizations/moments in the free layer 39 may be parallel to the fixed magnetic polarizations/moments of the pinned layer 29 (regardless of the initial magnetization direction), due to the up-spin electrons injected into the free layer 39. For example, when the free layer 39 is a SAF layer as described above, application of the positive write current +IW orients magnetic polarizations/moments in the lower ferromagnetic layer 33 of the SAF free layer parallel to the fixed magnetic polarizations/moments in the pinned layer 29. In addition, when both the pinned layer 29 and the free layer 39 are SAF layers as shown in FIGS. 2 and 3, application of the positive write current +IW orients magnetic polarizations/moments in the lower ferromagnetic layer 33 of the SAF free layer parallel to the fixed magnetic polarizations/moments in the upper ferromagnetic layer 27 of the SAF pinned layer 29. Accordingly, when the positive write current density is greater than a critical current density, the selected MTJ 41 may have a relatively low resistance value.

Similarly, when the negative write current −IW flows through the selected MTJ 41, electrons may be injected into the free layer 39. The electrons may include up-spin electrons and down-spin electrons. When a majority of the fixed magnetic polarizations/moments in the pinned layer 29 have up-spins, only the up-spin electrons injected into the free layer 39 may pass through the selected tunneling insulating layer 31 to reach the pinned layer 29. As such, the down-spin electrons may accumulate in the free layer 39. The number of up-spin electrons and down-spin electrons may be proportional to the current density of the negative write current −IW. Accordingly, when the negative write current density is increased, a majority of the magnetic polarizations/moments of the free layer 39 may be antiparallel to the magnetization direction of the pinned layer 29 (regardless of the initial magnetization direction). Thus, when the negative write current density is greater than the critical current density, the selected MTJ 41 may have a relatively high resistance value.

In order to change the resistance of the selected MRAM cell using the spin injection mechanism as described above, a write current density greater than the critical current density may be required. Accordingly, an access transistor TA having drive current capability sufficient to transmit a write current greater than the critical current density may be required. As such, when the selected MRAM cell is programmed using a spin injection mechanism requiring a higher write current density, it may be difficult to scale-down the access transistor TA. In other words, the access transistor TA may be a limiting factor in improving the integration density of the MRAM device. Accordingly, in order to provide writing/programming operations capable of reducing the write current density used to successfully change the resistance of the selected MRAM cell, some embodiments of the present invention may employ a magnet 52 positioned at one or more sidewalls of the MTJ 41 to generate a hard axis magnetic field Hh through the MTJ 41.

Writing/programming operations according to some embodiments of the present invention may include applying the word line signal and the bit line write signal, and applying the hard axis magnetic field Hh via the magnet(s) 52 positioned adjacent sidewalls of the MTJ 41. The hard axis magnetic field Hh may be a magnetic field that is parallel to the width direction of the MTJ 41, i.e., the hard axis direction of the MTJ 41.

More particularly, the hard axis magnetic field Hh may be generated by at least a pair of magnets 52 which are adjacent to opposing sidewalls of the MTJ 41, as shown in FIGS. 1 and 3. The hard axis magnetic field Hh is parallel to the hard magnetization axis of the MTJ 41, (i.e., the X-axis or width direction). When the write current is applied in combination with the hard axis magnetic field Hh, the magnetization of the MTJ 41 may be more easily switched due to the presence of the hard axis magnetic field Hh. For example, when the positive write current +IW is provided in the presence of the hard axis magnetic field Hh, magnetic polarizations/moments in the free layer 39 may be arranged parallel to magnetic polarizations/moments in the pinned layer 29 more easily, even when the positive write current +IW is relatively low. Similarly, when the negative write current −IW is provided in the presence of the hard axis magnetic field Hh, magnetic polarizations/moments in the free layer 39 may be arranged antiparallel to magnetic polarizations/moments in the pinned layer 29 more easily, even when the negative write current −IW is relatively low. As such, the hard axis magnetic field Hh may reduce a write current required to successfully switch the magnetization of the free layer 39 of the MTJ 41. In other words, application of the hard axis magnetic field Hh may lower the critical current density.

Still referring to FIGS. 1, 2, and 3, methods of reading the data stored in the MRAM cell may include applying a read voltage to both terminals of the MTJ 41 of the MRAM cell. For example, in order to read the data stored in the MRAM cell, a word line voltage may be applied to the word line to turn on the access transistor TA connected to the word line, and a ground voltage and a read voltage may be applied to the source line 13 and the bit line 49, respectively. As a result, the read current may flow through the MTJ 41 of the MRAM cell, and it may be determined whether the data stored in MRAM cell has a logic "0" or logic "1" value according to the amount of the read current. The read voltage may be sufficiently low in order to provide a read current that is less than a minimum write current.

Figure 4:
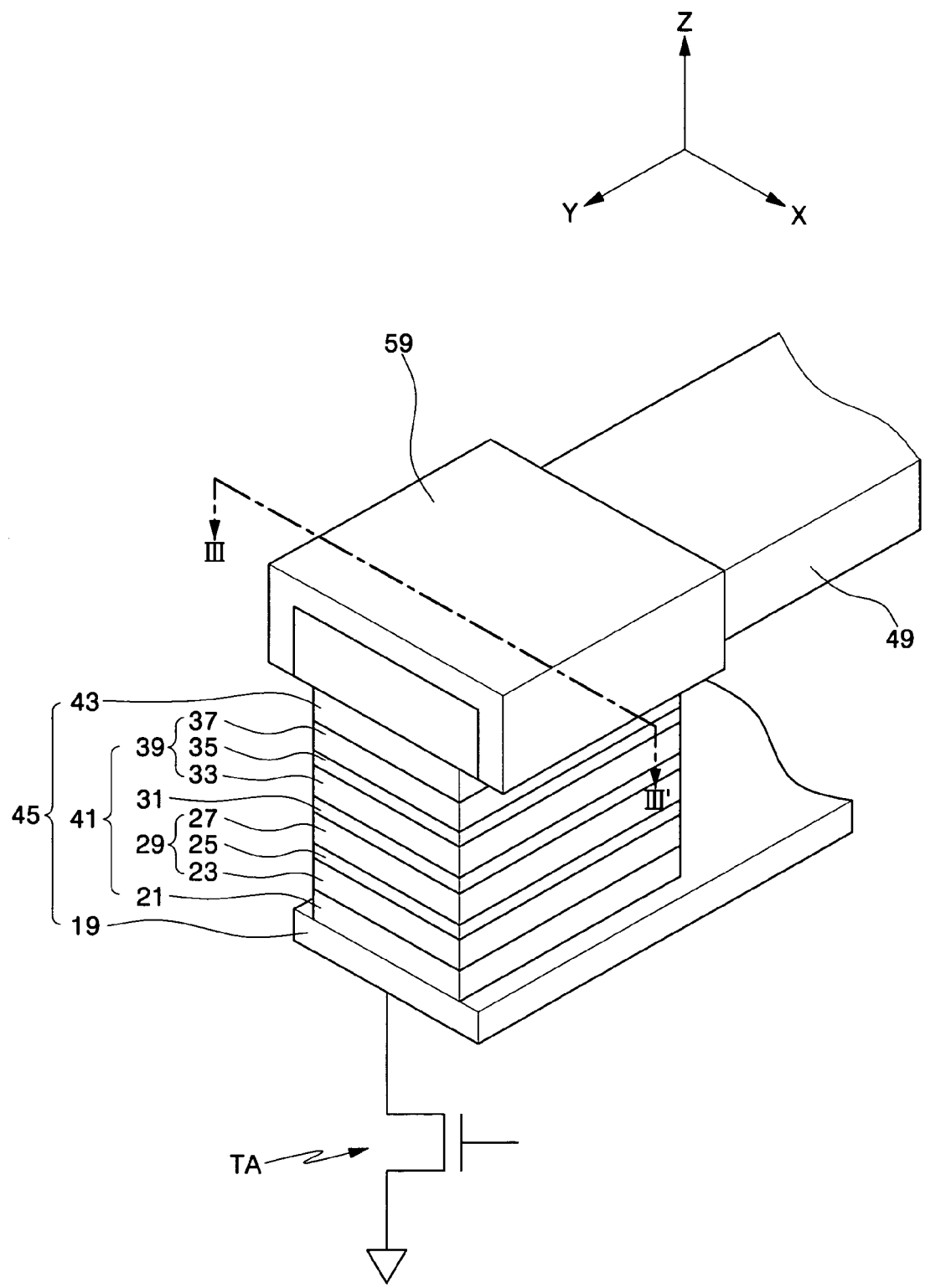
FIG. 4 is a perspective view of an MRAM device in accordance with further embodiments of the present invention.
Figure 5:
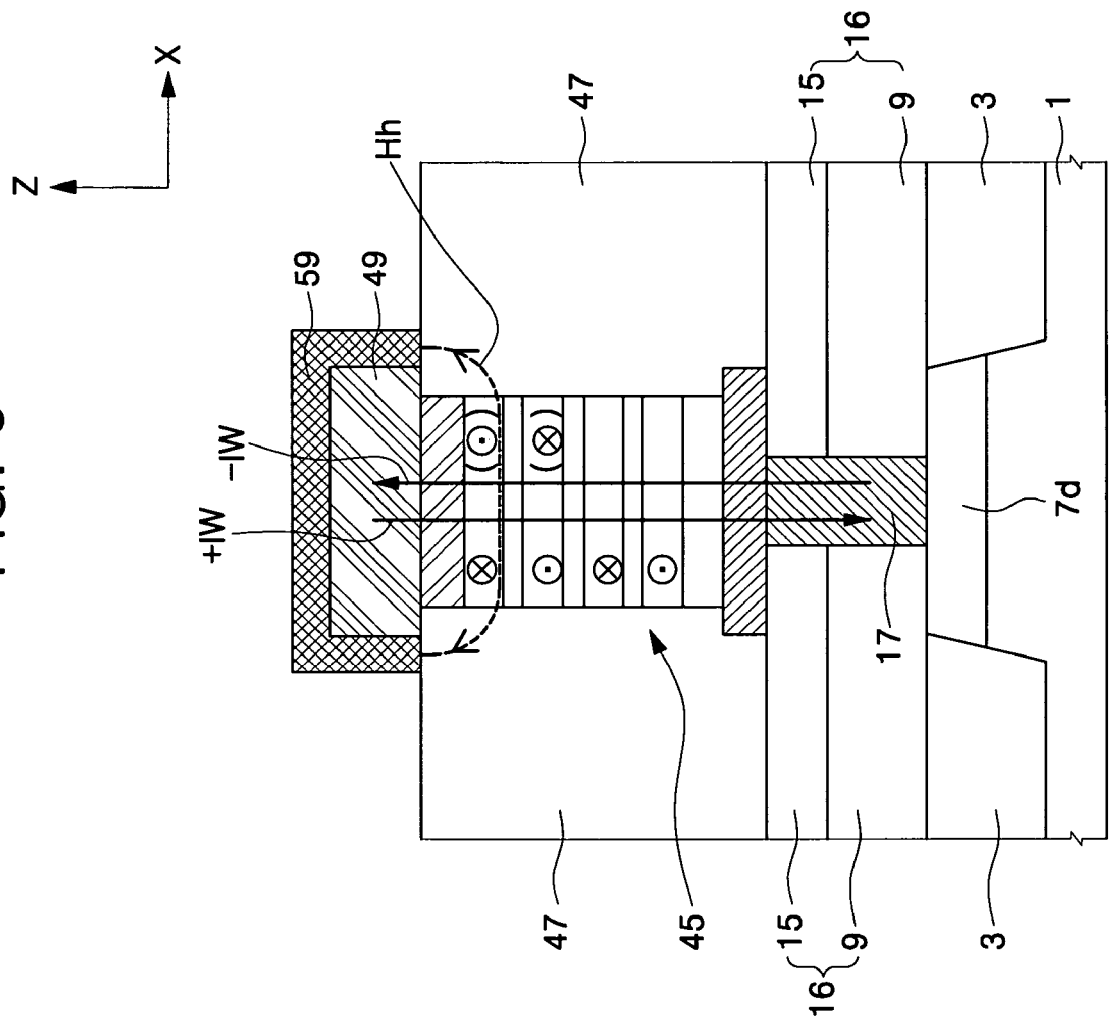
FIG. 5 is a cross-sectional view taken along line III-III' of FIG. 4.

FIG. 4 is a perspective view of a MTJ in a MRAM device in accordance with further embodiments of the present invention. FIG. 5 is a cross-sectional view taken along line III-III' of FIG. 4.

Referring to FIGS. 4 and 5, a MRAM device according to further embodiments of the present invention may include structures similar to those described above with reference to FIGS. 1 to 3, including the integrated circuit substrate 1, the first interlayer insulating layer 16 and the structures therebetween. In addition, the drain contact plug 17 extending through the first interlayer insulating layer 16 has a similar structure to that described above with reference to FIGS. 1 to 3.

A magnetic resistor 45 is formed on the first interlayer insulating layer 16 and on the drain contact plug 17. The magnetic resistor 45 includes a lower electrode 19, an upper electrode 43, and an MTJ 41 positioned therebetween. The MTJ 41 includes a pinned layer 29, a free layer 39, and a tunneling insulating layer 31 positioned therebetween. Furthermore, the MTJ 41 may include a pinning layer 21 contacting the pinned layer 29. Respective layers 19, 21, 29, 31, 39, and 43 of the magnetic resistor 45 may be stacked in various orders. For example, the lower electrode 19 may be in contact with the drain contact plug 17, and the pinning layer 21, the pinned layer 29, the tunneling insulating layer 31, and the free layer 39 may be stacked on the lower electrode 19 in the above order.

The free layer 39 may be a single layer of ferromagnetic material, or a synthetic anti-ferromagnetic (SAF) layer having a lower ferromagnetic layer 33, an anti-ferromagnetic coupling spacer layer 35, and an upper ferromagnetic layer 37 which are sequentially stacked as shown in FIGS. 2 and 5.

In addition, the pinned layer 29 may be a single layer of ferromagnetic material, or a synthetic anti-ferromagnetic (SAF) layer having a lower ferromagnetic layer 23, an anti-ferromagnetic coupling spacer layer 25, and an upper ferromagnetic layer 27 which are sequentially stacked, as shown in FIGS. 2 and 5.

A second interlayer insulating layer 47 is formed on the first interlayer insulating layer 16 and on the magnetic resistor 45. A bit line 49 is formed on the second interlayer insulating layer 47. The bit line 49 is electrically connected to the magnetic resistor 45 via the upper electrode 43.

The MTJ 41 may have a rectangular or elliptical shape (including a length and a width that is smaller than the length) when seen in a plan view. As such the MTJ 41 may have an easy magnetization axis in the length direction and a hard magnetization axis in the width direction, where the length and the width directions may be perpendicular to each other.

A magnetic layer 59 is formed on opposing sidewalls and an upper surface therebetween of the bit line 49. The magnetic layer 59 may be a permanent magnet and/or an electromagnet. The magnetic layer 59 may define a structure covering opposing sidewalls and a surface therebetween (such as an upper surface) of the bit line 49. Alternatively, the magnetic layer 59 may cover only portions of the sidewalls and the upper surface of the bit line 49. In addition, the magnetic layer 59 may include a plurality of magnetic layers covering portions of the sidewalls and/or the upper surface of the bit line 49. In such a case, the bit line 49 may be positioned parallel to the easy magnetization axis or at an intersection angle of less than 90° from the easy magnetization axis.

Writing/programming methods according to further embodiments of the present invention will now be described with reference to FIGS. 4 and 5.

Referring again to FIGS. 4 and 5, a word line signal is applied to the word line (i.e., the gate electrode 5) of the access transistor TA and a bit line write signal is applied to the bit line 49. The word line signal may be a voltage pulse signal having a voltage higher than a threshold voltage of the access transistor TA, and may be applied for a predetermined time. In addition, the bit line write signal may be a current pulse signal providing current to the bit line when the word line signal is applied. As a result, the MRAM cell connected to the word line and the bit line may be selected, and the write current may flow through the MTJ 41 of the selected MRAM cell and the access transistor TA connected in series with the cell.

The write current may be a positive write current +IW which flows from the free layer 39 of the selected MTJ 41 to the pinned layer 29 thereof, or a negative write current −IW which flows from the pinned layer 29 to the free layer 39.

When the source line 13 is grounded during a writing/programming operation, the positive write current +IW may be generated by applying a positive program voltage to the selected bit line. Similarly, when the source line 13 is grounded during the writing/programming operation, the negative write current −IW may be generated by applying a negative program voltage to the selected bit line.

When the positive write current +IW flows through the selected MTJ 41, a majority of the electrons which pass through the selected pinned layer 29 may be changed to have spins in the same magnetization direction as the fixed magnetic polarizations/moments in the pinned layer 29. Accordingly, when the positive write current density is increased, a majority of the magnetic polarizations/moments in the free layer 39 may be parallel to the fixed magnetic polarizations/moments in the selected pinned layer 29, regardless of the initial magnetization direction. For example, when the free layer 39 is a SAF layer as described above, application of the positive write current +IW orients magnetic polarizations/moments in the lower ferromagnetic layer 33 of the SAF free layer parallel to the fixed magnetic polarizations/moments in the selected pinned layer 29. In addition, when both the pinned layer 29 and the free layer 39 are SAF layers, application of the positive write current +IW orients magnetic polarizations in the lower ferromagnetic layer 33 of the SAF free layer parallel to fixed magnetic polarizations/moments in the upper ferromagnetic layer 27 of the SAF pinned layer 29. Accordingly, when the positive write current density is greater than the critical current density, the selected MTJ 41 may have a relatively low resistance value.

Similarly, when the negative write current −IW flows through the selected MTJ 41, electrons may be injected into the free layer 39. As described above with reference to FIGS. 1 to 3, when the negative write current density is greater than the critical current density, the selected MTJ 41 may have a relatively high resistance value.

In order to change the resistance of the selected MRAM cell using the spin injection mechanism as described above, a write current density greater than the critical current density may be required. Accordingly, writing/programming methods according to further embodiments of the present invention employ a magnetic layer 59 on the opposing sidewalls and the upper surface therebetween of the bit line 49 to provide a hard axis magnetic field Hh capable of reducing the write current density required to successfully change the resistance of the selected MRAM cell.

Writing/programming operations according to further embodiments of the present invention include applying the word line signal and the bit line write signal, and applying the hard axis magnetic field Hh via the magnetic layer 59 formed on the opposing sidewalls and the upper surface of the bit line 49 of the MTJ 41. The hard axis magnetic field Hh may be a magnetic field that is parallel to the width direction of the MTJ 41, i.e., the hard axis direction of the MTJ 41.

More specifically, the hard axis magnetic field Hh may be generated by the magnetic layer 59 covering at least a portion of the opposing sidewalls and a surface therebetween of the bit line 49, as shown in FIGS. 4 and 5. The hard axis magnetic field Hh is parallel to the hard magnetization axis of the MTJ 41, i.e., the X-axis direction. When the write current is applied in combination with the hard axis magnetic field Hh, the MTJ 41 may be more easily switched. For example, when the positive write current +IW is provided in the presence of the hard axis magnetic field Hh, magnetic polarizations/moments in the free layer 39 may be more easily arranged parallel to magnetic polarizations/moments in the pinned layer 29 with the aid of the hard axis magnetic field Hh, even when the positive write current +IW is relatively low. Similarly, when the negative write current −IW is provided in the presence of the hard axis magnetic field Hh, magnetic polarizations/moments in the free layer 39 may be more easily arranged antiparallel to magnetic polarizations/moments in the pinned layer 29 with the aid of the hard axis magnetic field Hh, even when the negative write current −IW is relatively low. Accordingly, the hard axis magnetic field Hh may reduce a write current required to successfully switch the magnetization of the free layer 39 of the MTJ 41. In other words, application of the hard axis magnetic field Hh may lower the critical current density.

Methods of reading the data stored in the MRAM cell may include applying a read voltage to both terminals of the MTJ 41 of the MRAM cell, as described above with reference to FIGS. 1 to 3. For example, in order to read the data stored in the MRAM cell, a word line voltage may be applied to the word line to turn on the access transistor TA connected to the word line, and a ground voltage and a read voltage may be applied to the source line 13 and the bit line 49, respectively. As a result, the read current may flow through the MTJ 41 of the MRAM cell, and it may be determined whether the data stored in the MRAM cell has a logic "0" or logic "1" value according to the amount of the read current. The read voltage may be sufficiently low in order to provide a read current that is less than a minimum write current.

Figure 6:
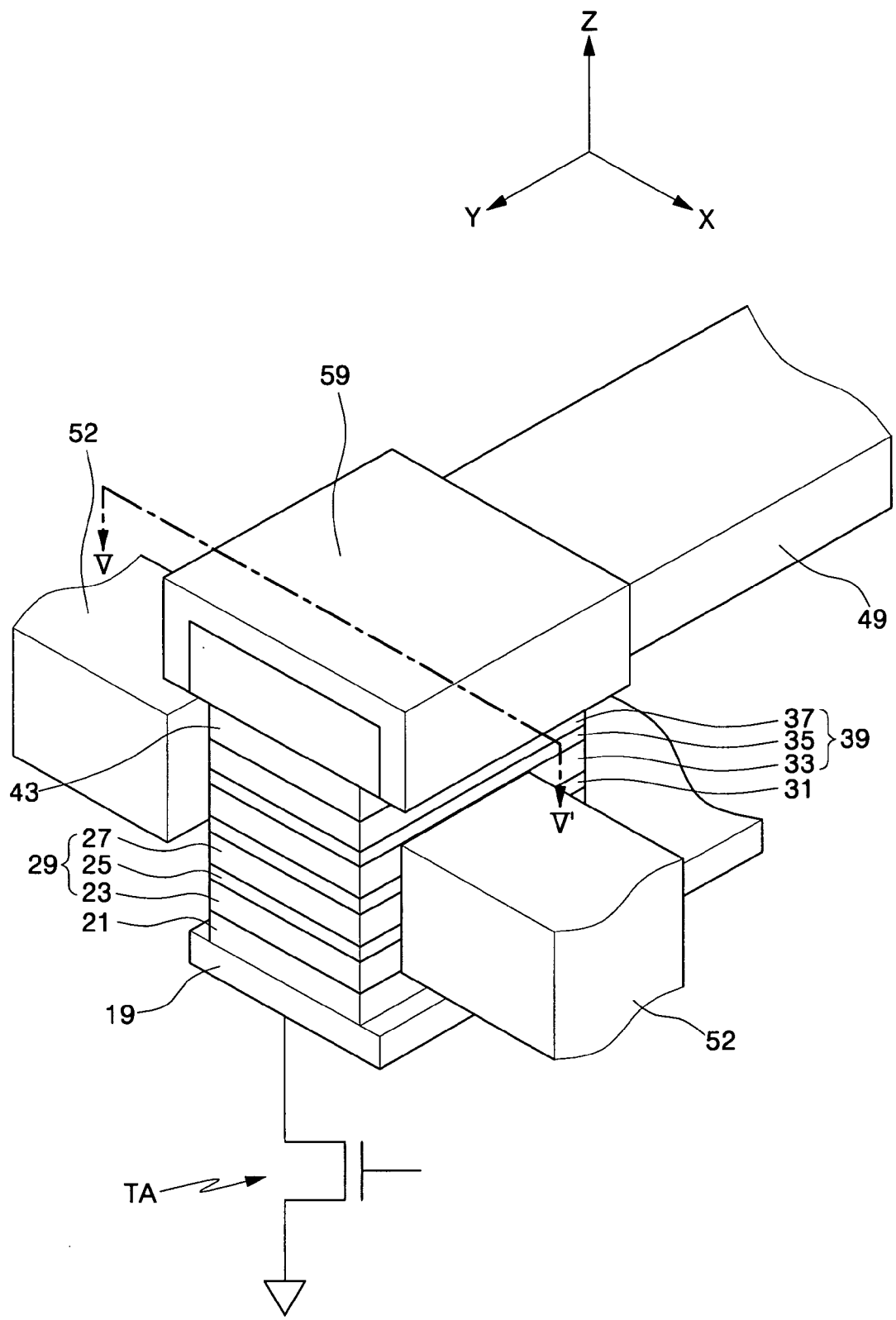
FIG. 6 is a perspective view of a portion of an MRAM device in accordance with still further embodiments of the present invention.
Figure 7:
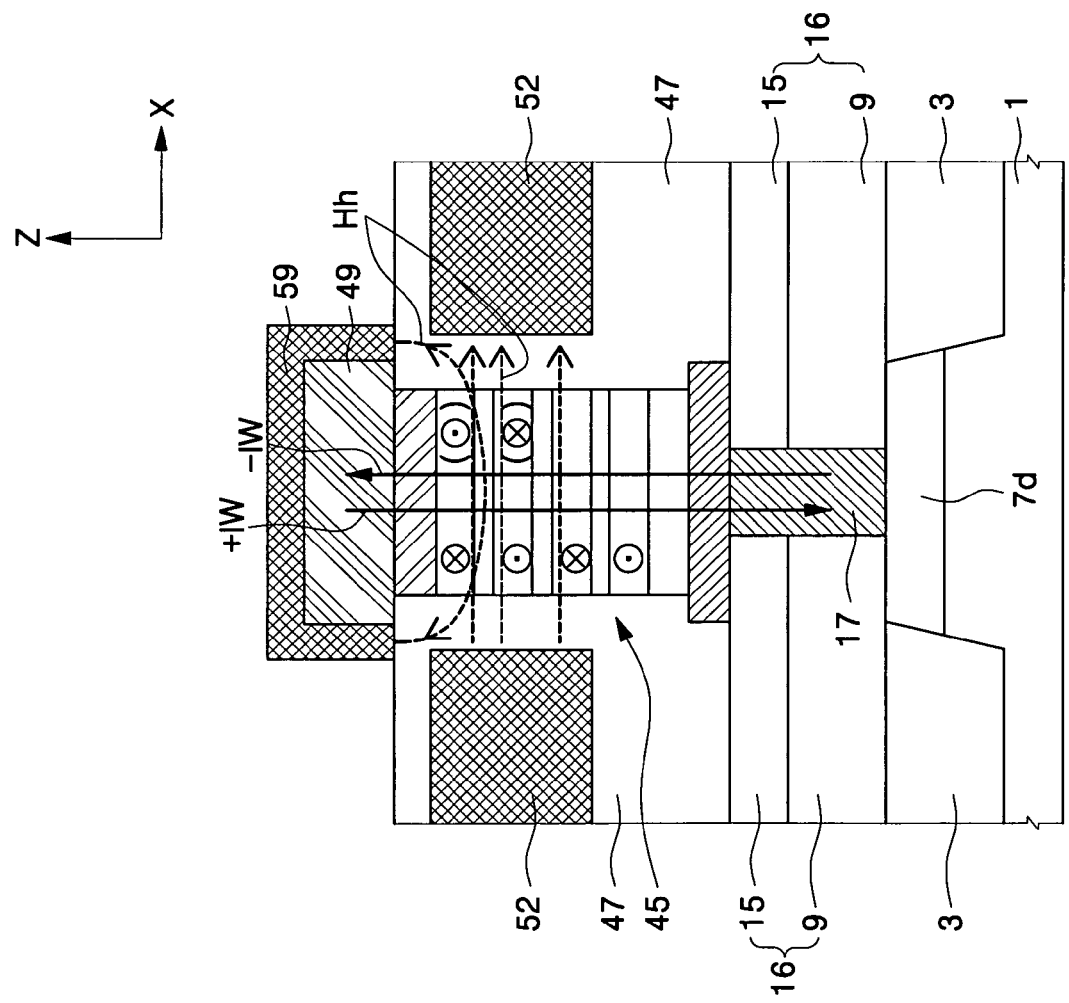
FIG. 7 is a cross-sectional view taken along line V-V' of FIG. 6.

FIG. 6 is a perspective view of a MTJ in a MRAM device in accordance with still further embodiments of the present invention. FIG. 7 is a cross-sectional view taken along line V-V' of FIG. 6.

Referring to FIGS. 6 and 7, a MRAM device according to still further embodiments of the present invention may include structures similar to those described above with reference to FIGS. 1 to 5, including the integrated circuit substrate 1, the first interlayer insulating layer 16, and the structures therebetween. In addition, the drain contact plug 17 extending through the first interlayer insulating layer 16 has a similar structure to that described above with reference to FIGS. 1 to 5.

A magnetic resistor 45 is formed on the first interlayer insulating layer 16 and on the drain contact plug 17. The magnetic resistor 45 includes a lower electrode 19, an upper electrode 43, and an MTJ 41 positioned therebetween. The MTJ 41 includes a pinned layer 29, a free layer 39, and a tunneling insulating layer 31 positioned therebetween. Furthermore, the MTJ 41 may include a pinning layer 21 contacting the pinned layer 29. Respective layers 19, 21, 29, 31, 39, and 43 of the magnetic resistor 45 may be stacked in various orders. For example, the lower electrode 19 may be in contact with the drain contact plug 17, and the pinning layer 21, the pinned layer 29, the tunneling insulating layer 31, and the free layer 39 may be stacked on the lower electrode 19 in the above order.

The free layer 39 may be a single layer of ferromagnetic material, or a synthetic anti-ferromagnetic (SAF) layer having a lower ferromagnetic layer 33, an anti-ferromagnetic coupling spacer layer 35, and an upper ferromagnetic layer 37 which are sequentially stacked as shown in FIGS. 2 and 7.

In addition, the pinned layer 29 may be a single layer of ferromagnetic material, or a synthetic anti-ferromagnetic (SAF) layer having a lower ferromagnetic layer 23, an anti-ferromagnetic coupling spacer layer 25, and an upper ferromagnetic layer 27 which are sequentially stacked as shown in FIGS. 2 and 7.

A second interlayer insulating layer 47 is formed on the first interlayer insulating layer 16 and on the magnetic resistor 45. A bit line 49 is formed on the second interlayer insulating layer 47. The bit line 49 is electrically connected to the magnetic resistor 45 via the upper electrode 43.

The MTJ 41 may have a rectangular or elliptical shape (including a length and a width that is smaller than the length) when seen in a plan view. Accordingly, the MTJ 41 may have an easy magnetization axis along the length direction and a hard magnetization axis along the width direction, where the length and the width directions may be perpendicular to each other. The bit line 49 may be parallel to the length direction.

At least one pair of magnets 52 is positioned adjacent opposing sidewalls of the MTJ 41 at opposite sides of the bit line 49, i.e., along the width direction. More particularly, one of the magnets 52 is positioned at one side of the magnetization hard axis, and the other is positioned at the other side of the hard axis, spaced apart from the MTJ 41 by the second interlayer insulating layer 47. The magnets 52 may be permanent magnets and/or electromagnets.

In addition, a magnetic layer 59 is formed on opposing sidewalls and an upper surface therebetween of the bit line 49. The magnetic layer 59 may be a permanent magnet and/or an electromagnet. The magnetic layer 59 may define a structure covering the upper surface and sidewalls of the bit line 49. Alternatively, the magnetic layer 59 may cover only portions of the sidewalls and the upper surface of the bit line 49. In addition, the magnetic layer 59 may include a plurality of magnetic layers covering portions of the sidewalls and/or the upper surface of the bit line 49. In such a case, the bit line 49 may be positioned parallel to the easy magnetization axis or at an intersection angle of less than 90° from the easy magnetization axis.

Writing/programming operations according to still further embodiments of the present invention will now be described with reference to FIGS. 6 and 7.

Referring again to FIGS. 6 and 7, a word line signal is applied to the word line (i.e., the gate electrode 5) of the access transistor TA and a bit line write signal is applied to the bit line 49. The word line signal may be a voltage pulse signal having a voltage greater than a threshold voltage of the access transistor TA, and may be applied for a predetermined time. In addition, the bit line write signal may be a current pulse signal providing current to the bit line when the word line signal is applied. As a result, the MRAM cell connected to the word line and the bit line may be selected, and the write current may flow through the MTJ 41 of the selected MRAM cell and the access transistor TA connected in series to the cell.

The write current may be a positive write current +IW which flows from the free layer 39 of the selected MTJ 41 to the pinned layer 29 thereof, or a negative write current −IW which flows from the pinned layer 29 to the free layer 39.

When the source line 13 is grounded during a writing/programming operation, the positive write current +IW may be generated by applying a positive program voltage to the selected bit line. Similarly, when the source line 13 is grounded during the writing/programming operation, the negative write current −IW may be generated by applying a negative program voltage to the selected bit line.

When the positive write current +IW flows through the selected MTJ 41, a majority of the electrons which pass through the selected pinned layer 29 may be changed to have spins in the same magnetization direction as the fixed magnetic polarizations/moments in the pinned layer 29. When the positive write current density is increased, a majority of the magnetic polarizations/moments in the free layer 39 may be parallel to the fixed magnetic polarizations/moments in the selected pinned layer 29 regardless of the initial magnetization direction. For example, when the free layer 39 is a SAF layer as described above, application of the positive write current +IW orients the magnetic polarizations/moments in the lower ferromagnetic layer 33 of the SAF free layer parallel to the fixed magnetic polarizations/moments in the pinned layer 29. In addition, when both the pinned layer 29 and the free layer 39 are SAF layers, application of the positive write current +IW orients the magnetic polarizations/moments in the lower ferromagnetic layer 33 of the SAF free layer parallel to fixed magnetic polarizations/moments in the upper ferromagnetic layer 27 of the SAF pinned layer 29. As such, when the positive write current density is greater than the critical current density, the selected MTJ 41 may have a relatively low resistance value.

Likewise when the negative write current −IW flows through the selected MTJ 41, electrons may be injected into the free layer 39. As described above with reference to FIGS. 1 to 5, when the negative write current density is greater than the critical current density, the selected MTJ 41 may have a relatively high resistance value.

In order to switch the magnetization (and thereby change the resistance) of the selected MRAM cell using the spin injection mechanism as described above, a write current density greater than the critical current density may be required. Accordingly, writing/programming operations according to still further embodiments of the present invention employ magnets 52 adjacent the opposing sidewalls of the MTJ 41 in addition to a magnetic layer 59 on the opposing sidewalls and the upper surface therebetween of the bit line 49 to generate a hard axis magnetic field Hh capable of reducing the write current density required to successfully switch the selected MRAM cell.

Writing/programming operations according to still further embodiments of the present invention, include applying the word line signal and the bit line write signal, and applying the hard axis magnetic field Hh using both the magnets 52 adjacent the opposing sidewalls of the MTJ 41 and the magnetic layer 59 on the opposing sidewalls and the upper surface of the bit line 49 of the MTJ 41. The hard axis magnetic field Hh may be a magnetic field that is parallel to the width direction of the MTJ 41, i.e., the hard axis direction of the MTJ 41.

In greater detail, the hard axis magnetic field Hh may be generated by at least a pair of magnets 52 adjacent to and parallel to the MTJ 41 and a magnetic layer 59 covering at least a portion of the sidewalls and the upper surface of the bit line 49, as shown in FIGS. 6 and 7. The hard axis magnetic field Hh is parallel to the hard magnetization axis of the MTJ 41, i.e., the X-axis direction. When the write current is applied in combination with the hard axis magnetic field Hh, the MTJ 41 may be more easily switched. For example, when the positive write current +IW is provided in the presence of the hard axis magnetic field Hh, magnetic polarizations/moments in the free layer 39 may be more easily arranged parallel to magnetic polarizations/moments in the pinned layer 29 with the aid of the hard axis magnetic field Hh, even when the positive write current +IW is relatively low. Similarly, when the negative write current −IW is provided in the presence of the hard axis magnetic field Hh, magnetic polarizations/moments in the free layer 39 may be more easily arranged antiparallel to magnetic polarizations/moments in the pinned layer 29 with the aid of the hard axis magnetic field Hh even when the negative write current −IW is relatively low. Thus, the hard axis magnetic field Hh may reduce a write current required to successfully switch the MTJ 41. In other words, application of the hard axis magnetic field Hh may lower the critical current density.

Methods of reading the data stored in the MRAM cell may include applying a read voltage to both terminals of the MTJ 41 of the MRAM cell as described above with reference to FIGS. 1 to 5. For example, in order to read the data stored in the MRAM cell, a word line voltage may be applied to the word line to turn on the access transistor TA connected to the word line, and a ground voltage and a read voltage may be applied to the source line 13 and the bit line 49, respectively. As a result, the read current may flow through the MTJ 41 of the MRAM cell, and it may be determined whether the data stored in the MRAM cell has a logic "0" or logic "1" value according to the amount of the read current. The read voltage may be sufficiently low in order to provide a read current that is less than a minimum write current.

Figure 8:
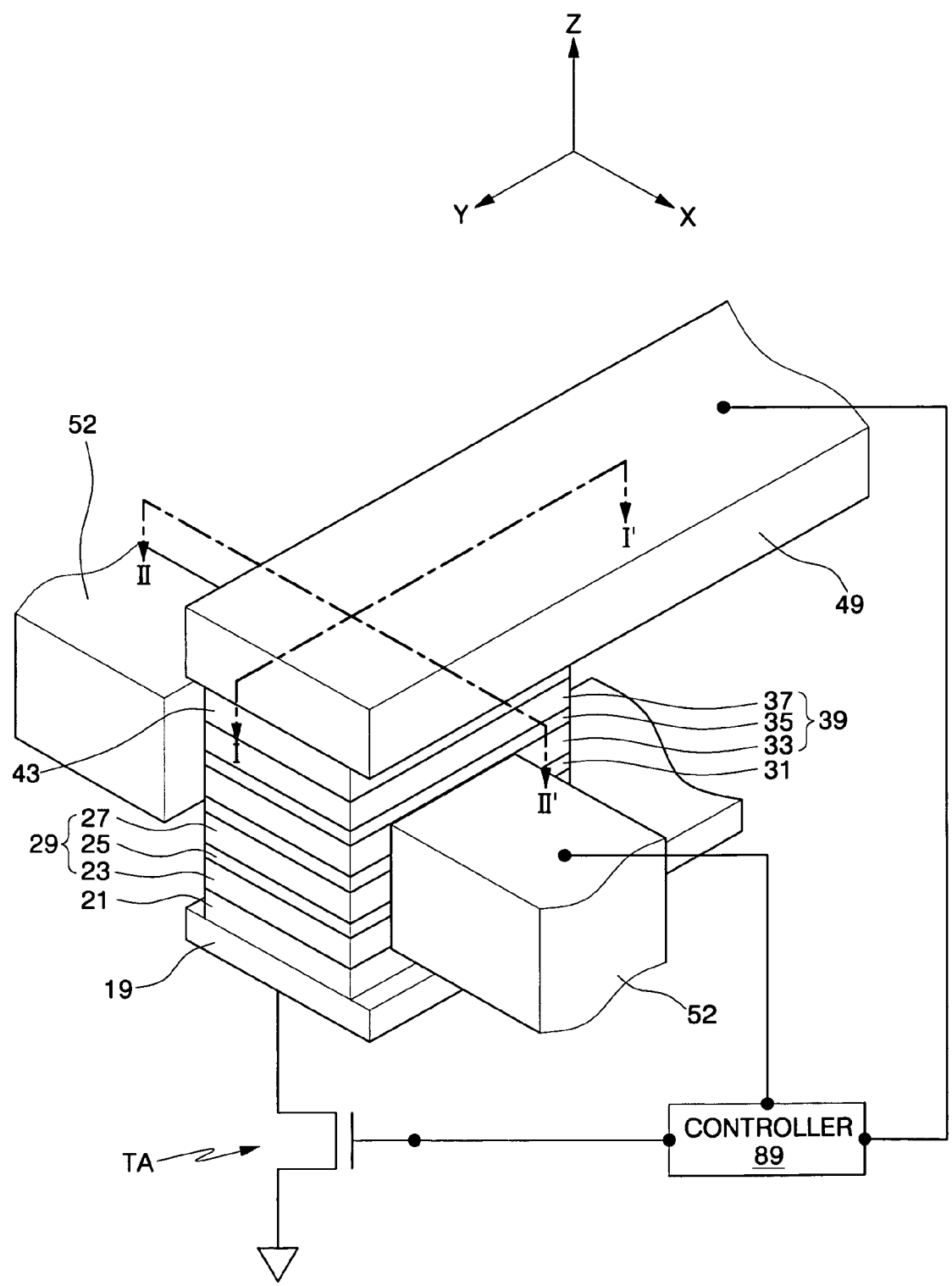
FIG. 8 is a perspective view of an MRAM device including a controller connected thereto in accordance with some embodiments of the present invention.

FIG. 8 is a perspective view of an MRAM device including a controller connected thereto in accordance with some embodiments of the present invention. Referring to FIG. 8, a MRAM device may include structures similar to those described above with reference to FIGS. 1 to 3, including the integrated circuit substrate 1, the access transistor TA, the bit line 49, and the MTJ 41 therebetween. In addition, a controller 89 is coupled to the bit line 49 and the gate electrode 5 of the access transistor TA. The controller 89 provides a word line signal to the gate electrode 5 of the access transistor TA. The access transistor TA is turned on while the word line signal is applied. The controller 89 further provides a bit line write signal to the bit line 49 when the word line signal is applied. As a result, the controller 89 can select the MRAM cell connected to the gate electrode 5 and the bit line 49, and can provide a writing current through the bit line 49, through the MTJ 41, and through the access transistor TA to provide the functionality described above with reference to FIGS. 1 to 3. The controller may also be coupled to the pair of magnets 52 adjacent opposing sidewalls of the MTJ 41 to provide a current thereto, for example, when the magnets 52 are electromagnets.

Figure 9:
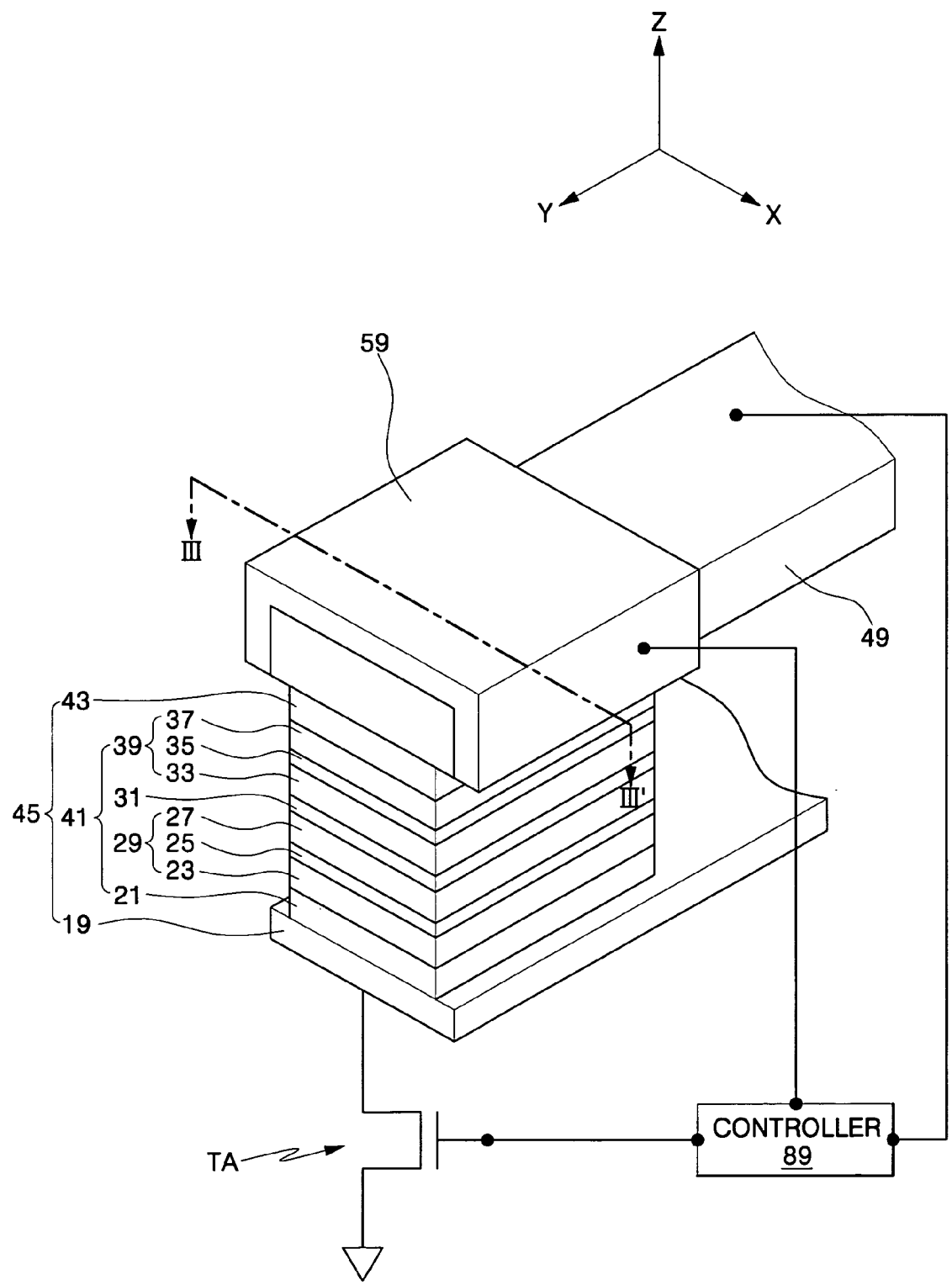
FIG. 9 is a perspective view of an MRAM device including a controller connected thereto in accordance with further embodiments of the present invention.

FIG. 9 is a perspective view of an MRAM device including a controller connected thereto in accordance with further embodiments of the present invention. Referring to FIG. 9, a MRAM device may include structures similar to those described above with reference to FIGS. 4 and 5, including the integrated circuit substrate 1, the access transistor TA, the bit line 49, and the MTJ 41 therebetween. In addition, a controller 89 is coupled to the bit line 49 and the gate electrode of the access transistor TA. The controller 89 provides a word line signal to the gate electrode of the access transistor TA. The access transistor TA is turned on while the word line signal is applied by the controller 89. The controller 89 further provides a bit line write signal to the bit line 49 when the word line signal is applied. As a result, the controller 89 can select the MRAM cell connected to the gate electrode and the bit line 49, and can provide a writing current through the bit line 49, through the MTJ 41, and through the access transistor TA to provide the functionality described above with reference to FIGS. 4 and 5. The controller may also be coupled to the magnetic layer 59 on opposing sidewalls and the upper surface of the bit line 49 to provide a current thereto, for example, when the magnetic layer 59 is an electromagnet.

Figure 10:
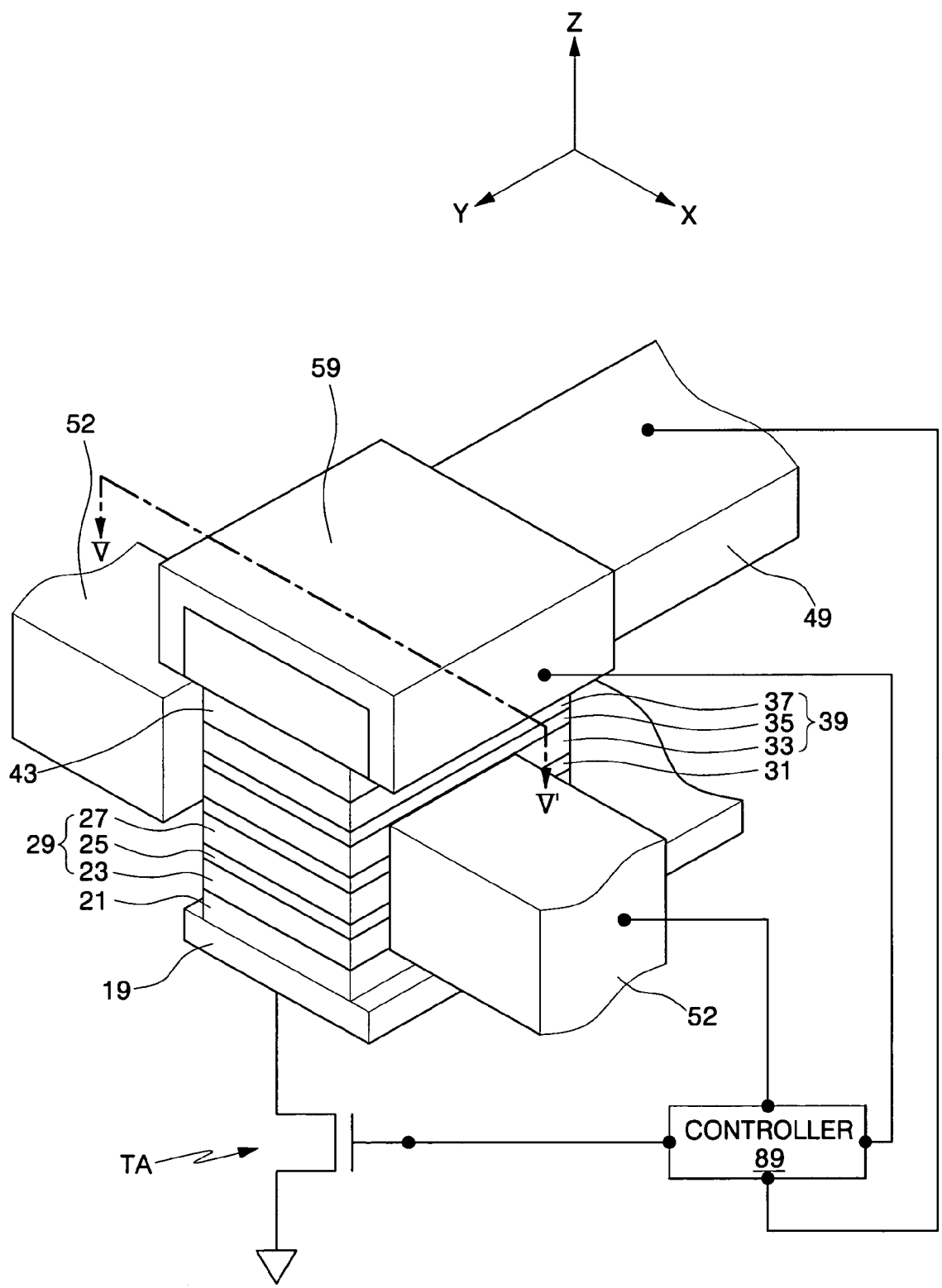
FIG. 10 is a perspective view of an MRAM device including a controller connected thereto in accordance with still further embodiments of the present invention.

FIG. 10 is a perspective view of an MRAM device including a controller connected thereto in accordance with still further embodiments of the present invention. Referring to FIG. 10, a MRAM device may include structures similar to those described above with reference to FIGS. 6 and 7, including the integrated circuit substrate 1, the access transistor TA, the bit line 49, and the MTJ 41 therebetween. In addition, a controller 89 is coupled to the bit line 49 and the gate electrode of the access transistor TA. The controller 89 provides a word line signal to the gate electrode of the access transistor TA. The access transistor TA is turned on while the word line signal is applied by the controller 89. The controller 89 further provides a bit line write signal to the bit line 49 when the word line signal is applied. As a result, the controller 89 can select the MRAM cell connected to the gate electrode and the bit line 49, and can provide a writing current through the bit line 49, through the MTJ 41, and through the access transistor TA to provide the functionality described above with reference to FIGS. 6 and 7. The controller may also be coupled to the pair of magnets 52 adjacent opposing sidewalls of the MTJ 41 and/or to the magnetic layer 59 on opposing sidewalls and the upper surface of the bit line 49 to provide a current thereto, for example, when the pair of magnets 52 and/or the magnetic layer 59 are electromagnets.

According to some embodiments of the present invention as described above, a hard axis magnetic field may be provided through a MTJ of a selected MRAM cell concurrently with a writing current applied to the MTJ, in order to selectively switch the magnetization (and thereby alter the resistance) of the MRAM cell using a spin injection mechanism. The hard axis magnetic field may be generated by at least one pair of magnets adjacent to opposing sidewalls of the MTJ and/or a magnetic layer covering opposing sidewalls and a surface therebetween of the bit line. Accordingly, the write current required to switch the selected MRAM cell may be reduced with the aid of the hard axis magnetic field.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A method of operating a magnetic random access memory device including a memory cell having a magnetic tunnel junction structure connected between a bit line and a memory cell access transistor on a substrate, and including at least one magnet adjacent a sidewall of the magnetic tunnel junction structure, the method comprising:

providing a magnetic field through the magnetic tunnel junction structure using the at least one magnet; and providing a writing current through the bit line, through the magnetic tunnel junction structure and through the memory cell access transistor while providing the magnetic field.

2. The method of claim 1, wherein the at least one magnet comprises a pair of magnets adjacent opposing sidewalls of the magnetic tunnel junction structure, and wherein providing a magnetic field comprises:

providing the magnetic field along a hard magnetization axis of the magnetic tunnel junction structure.

3. The method of claim 1, wherein providing a writing current comprises:

providing a first writing current in a first direction to reduce a resistance of the magnetic tunnel junction structure; and providing a second writing current in a second direction opposite the first direction to increase the resistance of the magnetic tunnel junction structure.

* * * * *